United States Patent [19]

Chao et al.

[11] Patent Number: 5,412,535
[45] Date of Patent: May 2, 1995

[54] APPARATUS AND METHOD FOR COOLING ELECTRONIC DEVICES

[75] Inventors: Shun-Lung Chao; Louis W. McEwin, Jr., both of Plano, Tex.

[73] Assignee: Convex Computer Corporation, Richardson, Tex.

[21] Appl. No.: 111,106

[22] Filed: Aug. 24, 1993

[51] Int. Cl.⁶ .............................................. H05K 7/20
[52] U.S. Cl. .................. 361/700; 29/890.032; 165/80.4; 165/179; 174/15.2
[58] Field of Search ......... 165/34, 80.3, 80.4, 165/104.33, 179, 182, 185; 174/15.2, 16.3; 29/890.032; 361/689, 699, 700

[56] References Cited

U.S. PATENT DOCUMENTS

| | | | |
|---|---|---|---|
| 2,883,591 | 4/1959 | Camp | 361/700 |
| 4,503,483 | 3/1985 | Basiulis | 361/700 |
| 4,633,371 | 12/1986 | Nagy et al. | 361/699 |
| 4,912,548 | 3/1990 | Shanker et al. | 165/104.33 |
| 4,951,740 | 8/1990 | Peterson et al. | 361/700 |
| 4,966,226 | 10/1990 | Hamburger | 361/700 |
| 5,095,404 | 3/1992 | Chao et al. | |
| 5,131,457 | 7/1992 | Fitzgerald | 165/34 |
| 5,206,791 | 4/1993 | Novotny | 361/700 |

FOREIGN PATENT DOCUMENTS

| | | | |
|---|---|---|---|
| 0134189 | 7/1985 | Japan | 165/104.33 |
| 208626 | 8/1989 | Japan | 165/104.33 |
| 2167550 | 5/1986 | United Kingdom | 165/104.33 |

OTHER PUBLICATIONS

"Heat Pipe Heat Sinks for Electronic Component Cooling", prepared by Thermacore, Inc. of Lancaster, Pa. for the IEPS Conference in San Diego Calif., Sep. 16-18, 1991.

Primary Examiner—Gregory D. Thompson
Attorney, Agent, or Firm—Winstead Sechrest & Minick

[57] ABSTRACT

A heat transfer assembly 11 is disclosed for transferring heat from a heat generating electronic device 15 or computer chip to ambient air. The heat transfer assembly 11 is comprised of a heat pipe 20 mounted perpendicular to a heat generating electronic device 15. The heat transfer assembly 11 is designed to provide a mechanically solid support for the bonding of the various heat transfer assembly components and to use circumferentially mounted fins 23 to increase the efficiency of heat transfer away from the electronic devices 15. The heat transfer assembly can function effectively when mounted in any direction. Thermocouples 42 are used to monitor the temperature and efficiency of the heat generating electronic device 15 such that corrective action can be initiated if the device begins to overheat.

40 Claims, 1 Drawing Sheet

APPARATUS AND METHOD FOR COOLING ELECTRONIC DEVICES

TECHNICAL FIELD OF THE INVENTION

The present invention relates to a heat transfer assembly and methods of making and using the same. In particular, the present invention relates to a heat pipe mounted on a heat generating electronic device, such as a computer chip, to transfer heat from the electronic device to air blown over the electronic device. The heat pipe dissipates heat essentially evenly along its length to gain efficient heat dissipation.

BACKGROUND OF THE INVENTION

As computer technology has progressed the density of electronic devices and chips within computer systems, as well as the quantity of heat produced by these devices has increased appreciably.

One of the ways employed in the past for cooling computer chips has been to blow air over the chips using a fan or blower. As the level of heat to be dissipated increases, heat sinks (such as a solid piece of a thermally conductive metal with fins) were attached to the chip and air blown across the extended surface of the heat sink. However, the use of a solid piece of metal, even aluminum or copper having a very high thermal conductivity to transfer heat, gives a significant temperature differential along the heat sink from the end connected to the heat source and the distal end with air blowing over it. If there is an insufficient transfer of heat, temperature will be high at the heat source preventing the use of high power, high density chips. In other words, the typical solid metal heat sink is too inefficient at conducting temperature away from a heat generating device to accommodate modern chip technology.

As the thermal loads of computer chips continued to increase, more effective ways to cool these chips were sought. One method developed to cool high density computer chips has been to immerse the circuit board containing the chips in a cooling liquid. Although a circulating cooling liquid has proven very effective at cooling electronic devices, a circulating fluid presents numerous disadvantages and is generally cumbersome and impractical. Liquid cooling of computer circuitry increases the cost of a computer, both its manufacturing costs and its maintenance costs. Furthermore, the plumbing and equipment necessary to circulate and cool the liquid dramatically increase the weight and complexity of the computer system.

Another method developed to cool high density computer chips has been to use a heat pipe to more efficiently transfer heat from the heat source to the air. A heat pipe is a heat transfer device consisting of a sealed metal tube with an inner lining of a wicklike capillary material and a small amount of working fluid. Heat is absorbed at one end by vaporization of the fluid and is released at the other end by condensation of the vapor. A variety of heat pipes are constructed as outlined in a brochure produced by Thermacore, Inc. (Lancaster, Pa.) for the IEPS conference in San Diego, Calif., Sep.-16–18, 1991, which brochure is hereby incorporated by reference.

U.S. Pat. No. 5,095,404 (Chao patent) describes a circuit board assembly using a heat pipe to cool a high density tab automated bonding integrated circuit chip (TAB IC chip). The TAB IC chip has a small surface area (much less than 1.0 square inch), such that the circuit board assembly taught in the Chao patent requires heat to be transferred from the chip to a heat spreader, to a layer of thermal conductive material, and to a mounting pad before finally reaching a horizontally mounted heat pipe.

Today's supercomputers generate large amounts of heat that must be effectively removed from the operating chip to protect it from overheating. In order to accommodate the ever expanding need to handle increased heat dissipation, an efficient heat transfer system is needed to prevent thermal buildup within computer chips while in use.

Accordingly, it is an object of this invention to provide for a more efficient cooling means for transferring heat from a heat-generating computer chip to the surrounding air.

SUMMARY OF THE INVENTION

The present invention is a heat transfer assembly used to conduct heat from a heat generating electronic device to the ambient air and its method of manufacture. The heat transfer assembly is comprised of a heat pipe and a thermal interface material for connecting the heat pipe to a heat generating electronic device attached to a circuit board (with the electronic device sometimes mounted via a socket for receiving the electronic device). The device can include a stiffener and mounting screws for mechanically securing the components together. The heat transfer assembly can function efficiently when mounted in any direction and is designed to provide optimal heat transfer away from the electronic device to the air.

The heat pipe is composed of a thermally conductive material and has sufficient surface area to effectively release the heat generated by the electronic device. The heat pipe has a thermally conductive pad, that is substantially perpendicular to the cylindrical tube of the heat pipe. This pad has a similar surface area as the electronic device and can therefore be directly mounted on the electronic device with a layer of thermal grease or adhesive sandwiched between the heat pipe and electronic device. The surface area of the electronic device on which the heat pipe is mounted may be a thermally conductive metal or may be any other material constructed to provide efficient transfer of heat to the heat pipe.

Heat from the electronic device is transferred to the heat pipe which has a fluid contained within the pipe. The heat from the electrical device evaporates the fluid which then moves away from the heated or device end of the pipe dissipating heat along the length of the condenser. The fluid then condenses and flows back to the device end, where the heat transfer cycle repeats.

Furthermore, thermocouples affixed to the heat pipe may be used to monitor the temperature and efficiency of the electronic device. If the electronic device begins to overheat, the computer intelligence can be triggered to take corrective action to prevent the destruction of the device.

Accordingly, one feature and technical advantage of the invention is that heat can be directly transferred form the heat generating device to the heat pipe.

Another feature and advantage of the present invention is that it provides a monitoring system for thermal buildup within the heat generating device.

An additional feature and advantage of the invention is that the securing of the heat transfer assembly components to the circuit board provides a physical support for the weight of the heat transfer assembly components and minimizes potentially damaging deflections of the electronic device within its socket.

Yet another feature and advantage of the invention is that it can be mounted in any direction.

These and further features and advantages of the invention will be apparent from the following description of the preferred embodiments thereof.

The foregoing has outlined rather broadly the features and technical advantages of the present invention in order that the detailed description of the invention that follows may be better understood.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

The principles of the present invention are best understood by reference to the illustrated embodiment depicted in FIGS. 1-5 of the drawings, in which the numbers designate like parts.

Figure 1:
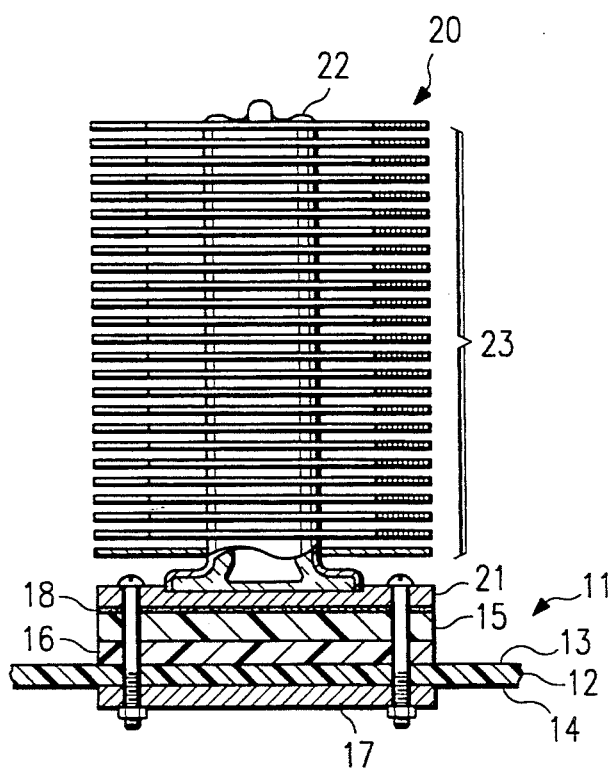
FIG. 1 shows a heat transfer assembly constructed according to the present invention.

FIG. 1 shows a heat transfer assembly constructed according to the present invention and identified generally by reference numeral 11. Heat transfer assembly 11 includes a printed circuit board 12 having a top side 13 and a bottom side 14. Heat transfer assembly 11 further includes heat pipe cooling device shown generally as numeral 20 attached to heat-generating electronic component 15. The heat-generating electronic component 15 is mounted in socket 16 that is attached to circuit board 12.

Heat transfer assembly 11 is constructed by attaching heat pipe cooling device 20 (hereinafter referred to as heat pipe), heat-generating electronic device 15, thermal adhesive 18 and socket 16 to top side 13 of circuit board 12 with four mounting screws or bolts (not shown) via holes 41 (shown in FIG. 4). A stiffener 17 may also be screwed or bolted to bottom side 14 of circuit board 12 as seen in FIG. 1. Stiffener 17 mounted on back side 14 of circuit board 12 helps stabilize heat transfer assembly 11 and minimizes deflections of electronic device 15 within socket 16. Bolting or screwing the entire heat transfer assembly 11 together through circuit board 12 physically supports the weight of the heat transfer assembly components and provides a mechanically solid support for the bonding between the various assembly components.

Figure 2:
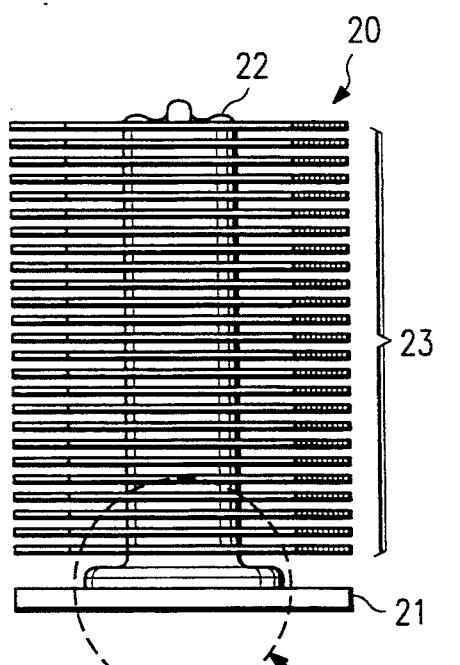
FIG. 2 shows one embodiment of a heat pipe cooling device.

Heat pipe 20, shown in FIG. 2, serves to remove the heat generated by electronic device 15. Heat pipe 20 is comprised of a pad 21, a sealed cylindrical tube 22, and a plurality of fins 23. Heat pipe 20 can be mounted in any direction, either vertical or horizontal, in relation to the heat generating electronic device 15. In the illustrated embodiment (FIG. 1) heat pipe 20 is bolted in a substantially perpendicular position to the heat generating device with a layer of thermal grease 18 between pad 21 and device 15. The pad may also be attached to device 15 by soldering or with a thermal adhesive.

Figure 3:
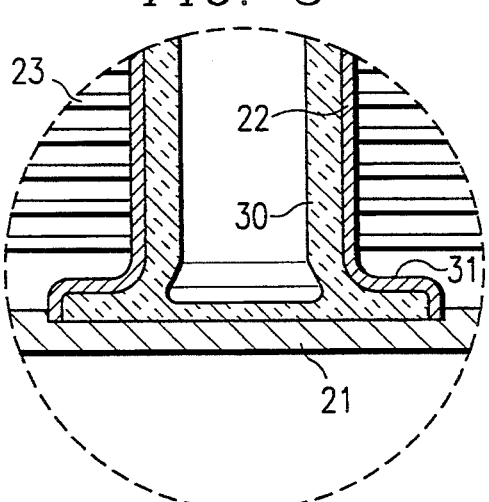
FIG. 3 shows a partial cross-section of the heat pipe cooling device taken along within the broken line circle of FIG. 2.

FIG. 3 shows a partial cross-section of heat pipe 20 taken along the section of FIG. 2 shown in dashed lines. The expanded portion 31 of cylindrical tube 22 improves the performance of heat pipe 20 by providing a larger area for heat transfer from pad 21 to the evaporator section of heat pipe 20. In a typical embodiment of heat transfer assembly 11 the cylindrical tube would be 0.75 inch in diameter and expanded portion 31 would be 1.25 inch in diameter. Of course these dimensions are relative and can be adjusted as desired for optimal heat transfer. Expanded portion 31 adjoins pad 21 such that pad 21 is substantially perpendicular to cylindrical tube 22.

Pad 21 is a machined essentially flat plate made of a thermally conductive material such as copper. In the illustrated embodiment, the bottom of pad 21 has essentially the same surface area as the top of electronic device 15 and can therefore be mechanically coupled to electronic device 15 with a layer of thermal grease between pad 21 and electronic device 15. Pad 21 may also be mounted on electronic device 15 with a thermally conductive adhesive such as epoxy or solder.

FIGS. 2 and 3 show a sealed cylindrical tube 22 lined on the inside with wick 30 and containing a working fluid (discussed in more detail below). Cylindrical tube 22 has an evaporator section proximal to pad 21 and a condenser section distal to the heat source and surrounded by ambient air. Heat is absorbed at the evaporator section of cylindrical tube 22 by vaporization of the working fluid. The resulting vapor will fill the sealed cylindrical tube 22 evenly transferring heat along the tube 22 to the plurality of fins 23. As ambient air is blown across the exterior of the condensing section of cylindrical tube 22 where fins 23 are attached, heat is released by condensation of the vapor and the condensed working fluid is returned by capillary wicking action to the evaporator section. This self-contained and self-operating process allows for the efficient transfer of heat along the condensing section of heat pipe 20. Heat transfer is sufficiently efficient to maintain the surface of electronic device 15 at an acceptable temperature level (i.e., 70° C. maximum) when ambient air (generally 32° C. to 50° C.) is blown across the condensing section of heat pipe 20, by a fan (not shown).

Figure 4:
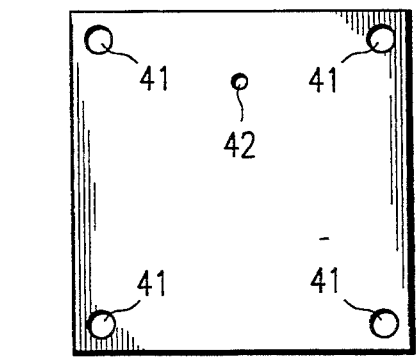
FIG. 4 shows an underside view of the heat pipe cooling device.

FIG. 4 shows an underside view of pad 21 with mounting holes 41 used to mount pad 21 to electronic device 15. Thermocouple 42 may be positioned on pad 21, or at any position along the heat pipe 20 or on fins 23. One or more thermocouples may be used to monitor the temperature of electronic device 15, heat pipe 20, or both. Thermocouple monitors may be used to track the temperature and efficiency of electronic device 15 to thereby provide a warning if the efficiency of electronic device 15 begins to fall or if the temperature of electronic device 15 is elevated beyond a critical point. The intelligence of the computer system can then be used to increase the air flow over the heated electronic device 15, to bypass or to power down the endangered circuit.

Figure 5:
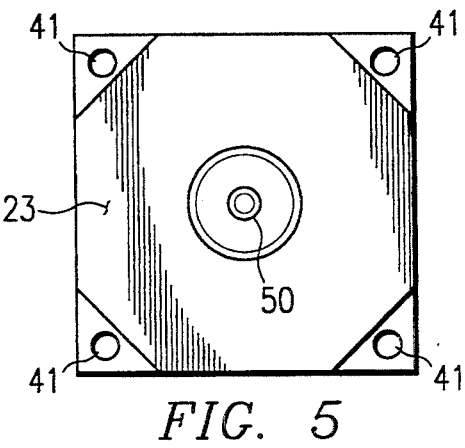
FIG. 5 shows a top side view of the heat pipe cooling device.

FIG. 5 shows a top view of heat pipe 20 with seal 50 hermetically sealing the top end of cylindrical tube 22. Fins 23 and mounting holes 41 are also shown.

In constructing heat pipe 20, a precleaned closed cylindrical tube 22 lined with wick 30 is evacuated of air and a working fluid injected. The heat pipe 20 is then sealed with hermetic seal 50. This process ensures that there are no internal contaminants or non-condensables, such as air, to interfere with the efficiency of the vaporization/condensation process.

The working fluid is selected for its heat transfer properties at the temperatures and pressures that the system will operate under. Water is the preferred working fluid but freon or methanol can also be used.

Wick 30 is selected for its capillary properties for it is the wick that returns the condensed working fluid back to the evaporator section. A sintered copper is a preferred embodiment, but any wick material that is compatible with the structure of the heat pipe can be used. A sintered copper wick, lining the interior of heat pipe 20, has sufficient capillary force to transport the condensed working fluid back to the evaporator section regardless of the orientation of heat pipe 20. However when heat pipe 20 is mounted in a vertical position, the condensed working fluid can be returned to the evaporator section by gravity without the use of a wick.

Fins 23 can be attached to cylindrical tube 22 by soldering, thermal adhesive, or mechanical/hydraulic expansion. A preferred embodiment mounts fins 23 along the exterior surface of cylindrical tube 22 by expanding tube 22 inside fins 23 either by pulling a mandrel through the tube to expand it or by applying hydraulic pressure to the inside of the tube to stretch tube 22 on each side of a fin and thereby hold the fin in place. This process of mounting fins 23 to cylindrical tube 22 provides for an efficient thermal interface from the cylindrical tube 22 to the fins 23.

The number and size of fins 23 required to meet the heat transfer needs of the electronic device will vary with the ambient air temperature and the velocity of air flow. If the air flow is low, the fins should be wider and spaced further apart to allow increased air/fin interface. Copper or aluminum fins, from 5 mil to 15 mil thick, are preferred and are mounted along tube 22. Although 5 to 15 fins per linear inch of tube 22 provide a usable heat pipe, generally 12 fins per inch provide an optimal arrangement.

Designing a particular heat pipe 20 for cooling a specific electronic device 15 must take into consideration the size of the electronic device 15, the heat generated by the device, the space between circuit boards and between heat generating devices on a circuit board, the surface area of pad 21, the diameter and height of heat pipe 20, the number and shape of fins 23, and the temperature and velocity of the air blowing over the heat pipe. A preferred embodiment of heat pipe 20 has a pad 21 that is approximately 2.4 square inches and a cylindrical tube 22 that is approximately 0.75 inch in diameter, expanding to approximately 1.25 inch at the expanded portion 31 of tube 22 proximal to pad 21. Fins 23 are spaced 12 per inch and are comprised of 10 mil sheets of copper which could be squares or disks. The cylindrical tube is also composed of copper and the wick is a sintered copper.

Not shown is the fact that the electrical device to be cooled is typically mounted on a circuit board, perhaps with many other such electrical devices. Thus, the heat pipe of the present invention could be used to transfer heat from a plurality of such electrical devices to provide efficient heat transfer for an entire computer system.

While preferred embodiments of the invention have been shown and described, it will be apparent to those skilled in the art that the conception and the specific embodiments disclosed may be readily utilized as a basis for modifying or designing other structures for carrying out the same purpose as the present invention. It should also be realized by those skilled in the art that such equivalent constructions do not depart from the spirit and scope of the invent as set forth in the appended claims.

What is claimed is:

1. A heat transfer device, said device mountable to a heat generating electrical device, said transfer device comprising:
   a heat pipe having a proximal end for mating with the electrical device and a sealed distal end;
   fin means retained to said heat pipe by an outward pressure exerted on said fin means by said heat pipe; and
   means for mounting said heat pipe such that said distal end is on an axis perpendicular to the plane of said electrical device.

2. The system set forth in claim 1 wherein said heat pipe includes:
   a fluid which vaporizes from the heat generated by the electrical device, and
   means for dissipating heat along the length of said heat pipe.

3. The device set forth in claim 1 wherein said mounting means includes a widened circumference of said heat pipe at said proximal end.

4. The device set forth in claim 3 wherein said mounting means further includes a relatively flat pad having dimensions substantially similar to the dimensions of said electrical device.

5. The device set forth in claim 4 wherein said mounting means includes means for rigidly affixing said heat pipe to said electrical device.

6. A heat transfer system comprising:
   a circuit board;
   a heat generating electronic device having a first and a second surface, said first surface positioned adjacent to said circuit board;
   a heat pipe attached to said second surface of said electronic device and extending perpendicular thereto; and
   a plurality of fins extending substantially perpendicular from said heat pipe, each of said fins retained to an outer wall of said heat pipe by an outward pressure exerted on each said fin by said heat pipe.

7. The system set forth in claim 6 wherein said heat pipe is attached to said electronic device by a pad dimensionally similar to said electronic device.

8. The system set forth in claim 7 wherein said heat pipe is a sealed tube with its proximal end receiving heat from said electrical device, said heat received by said plate in conjunction with a widened circumference of said pipe.

9. The system as set forth in claim 7 further comprising a thermocouple mounted to said pad for monitoring temperature of said system.

10. The system as set forth in claim 7, wherein said heat pipe is attached to said electronic device with thermal adhesive.

11. The system as set forth in claim 7, wherein said heat pipe is attached to said electronic device with thermally conductive solder.

12. The method of transferring heat from an electrical device, said method comprising the steps of:
   placing one end of a heat pipe in contact with said electrical device, said heat pipe including a fluid which evaporates when heat from said electrical device is communicated to said fluid and a mechanism for moving said fluid after condensation along said pipe to said one contact end of said pipe; and
   providing a plurality of fins radiating circumferentially outward along the length of the pipe, the fins held in place by an outward pressure exerted thereon by the pipe.

13. The method set forth in claim 12 wherein within said heat pipe a repetitive cycle is performed, said cycle including the following steps:
   the evaporation of said fluid at said one end of said pipe in contact with said electrical device;
   the dissipation of heat along the length of said pipe; and
   the condensation of said evaporated fluid along the length of said pipe; and
   the movement of said condensed fluid to said one contact end using said mechanism.

14. The method of claim 13 wherein said mechanism is a wick positioned laterally inside said pipe and extending from said one contact end and to said distal end.

15. The method of claim 13 wherein said dissipation step includes fins radiating circumferentially outward along the length of said pipe.

16. A method of making a heat transfer assembly comprising the steps of:
   (a) selecting a heat generating electronic device connected to a circuit board, said electronic device having at least one substantially flat surface facing outward from said board; and
   (b) attaching a heat pipe to a surface of said electronic device, said heat pipe comprising:
      a substantially flat pad for mating with said outward flat surface of said heat generating electronic device;
      a sealed hollow tube mounted perpendicularly to a side of said pad away from said electronic device for conducting heat away from said electronic device, said tube including an evaporator section proximal to said pad and a condenser section distal to said pad;
      a working fluid within said tube for absorbing heat by vaporization at said evaporator section and releasing heat by condensation at said condenser section;
      means within said tube for returning condensed working fluid from said condenser section to said evaporator section; and
      fin means for dissipating heat along the length of said tube, said fin means held in physical communication with said tube by an outward pressure exerted on said fin means by said tube.

17. The method set forth in claim 16 further including the step of attaching a stiffener to a side of said circuit board opposite from said electronic device.

18. The method set forth in claim 16, wherein said attaching step attaches said heat pipe to said electronic device with thermal adhesive.

19. The method set forth in claim 16, wherein said attaching step attaches said heat pipe to said electronic device with thermally conductive solder.

20. The method set forth in claim 16, further including the step of affixing a thermocouple to said heat pipe for monitoring thermal buildup within said electronic device.

21. The method set forth in claim 16, wherein said condensed fluid returning means includes a wick mounted within said tube.

22. A heat pipe comprising:
   a pad for mating with a heat generating electronic device;
   a hollow tube mounted perpendicularly to one side of said pad and sealed against said pad for conducting heat away from the electronic device, wherein said tube is comprised of an evaporator section proximal to said pad and a condenser section distal to said pad;
   a working fluid within said tube for absorbing heat by vaporization at said evaporator section and releasing heat by condensation at said condenser section;
   a wick within said tube for returning condensed working fluid from said condenser section to said evaporator section; and
   a plurality of fins mounted circumferentially along the length of said pipe and held in place by an outward pressure thereon by said heat pipe.

23. The heat pipe as set forth in claim 22, further including a thermocouple affixed to said heat pipe for monitoring thermal buildup in the electronic device.

24. The heat pipe as set forth in claim 23, wherein said thermocouple is affixed to said pad.

25. The heat pipe as set forth in claim 22, wherein said pad has a first surface area greater than one square inch.

26. The heat pipe as set forth in claim 22, wherein said pad is composed of copper.

27. The heat pipe as set forth in claim 22, wherein said tube is composed of copper.

28. The heat pipe is set forth in claim 22, wherein said tube has an enlarged diameter where said tube is mounted to said pad.

29. The heat pipe as set forth in claim 28, wherein said enlarged diameter is about 1.25 inch and said tube has a diameter of about 0.75 inch distal to where said tube is mounted to said pad.

30. The heat pipe as set forth in claim 22, wherein said tube is mounted to said pad by brazing.

31. The heat pipe as set forth in claim 22, wherein said pad is mounted to said electronic device with thermal adhesive.

32. The heat pipe as set forth in claim 22, wherein said working fluid is selected from the group consisting of water, methanol and freon.

33. The heat pipe as set forth in claim 22, wherein said working fluid is water.

34. The heat pipe as set forth in claim 22, wherein said wick is comprised of a sintered metal.

35. The heat pipe as set forth in claim 22, wherein said wick is comprised of sintered copper.

36. The heat pipe as set forth in claim 22, wherein said fins are composed of copper.

37. The heat pipe as set forth in claim 22, wherein said fins are spaced 12 per inch along the length of said tube.

38. The heat pipe as set forth in claim 37, wherein said fins are 10 mil thick.

39. A method of manufacturing a heat pipe comprising the steps of:

(a) selecting a hollow tube;
(b) mounting a plurality of fins circumferentially surrounding said tube by expanding said tube with pressure asserted from the inside of said tube;
(c) inserting within said tube a wicking material;
(d) attaching said tube substantially perpendicularly to a pad;
(e) generating a vacuum within said hermetically sealed tube;
(f) injecting a working fluid into said hermetically sealed tube; and
(g) hermetically sealing said tube.

40. The method set forth in claim 39, further comprising the step of enlarging the diameter of said tube where said tube is attached to said pad.

* * * * *